US006242768B1

(12) United States Patent
Yu

(10) Patent No.: US 6,242,768 B1
(45) Date of Patent: Jun. 5, 2001

(54) CHARGE COUPLED DEVICE AND A DRIVING METHOD THEREOF

(75) Inventor: Young-June Yu, Koyang (KR)

(73) Assignee: LG Semicon Co., Ltd., Chungcheongbuk-Do (KR)

( * ) Notice: Subject to any disclaimer, the term of this patent is extended or adjusted under 35 U.S.C. 154(b) by 0 days.

(21) Appl. No.: 09/337,755

(22) Filed: Jun. 22, 1999

(30) Foreign Application Priority Data

Jun. 24, 1998 (KR) .................................. 98-23806

(51) Int. Cl.$^7$ ..................... H01L 27/148; H01L 29/768
(52) U.S. Cl. ..................... 257/222; 257/233; 257/250
(58) Field of Search .................. 257/222, 232, 257/233, 250

(56) References Cited

U.S. PATENT DOCUMENTS

| 4,387,354 | 6/1983 | Angle ..................................... 333/165 |
| 4,757,365 | * 7/1988 | Boudewijns .......................... 257/222 |
| 5,731,601 | * 3/1998 | Shioyama et al. .................... 257/250 |
| 5,801,409 | * 9/1998 | Nam ...................................... 257/233 |

* cited by examiner

*Primary Examiner*—Gene M. Munson
(74) *Attorney, Agent, or Firm*—Morgan, Lewis & Bockius LLP

(57) ABSTRACT

The present invention relates to a charge coupled device (CCD) and a driving method, and the driving method of the CCD includes the steps of: providing a CCD including a semiconductor substrate, a photodiode in the semiconductor substrate, a charge transfer channel in the semiconductor substrate, and a charge transferring element including a first, a second, a third and a fourth transferring electrode with a three-level structure over the semiconductor substrate, wherein the charge transferring element transfers electric charges from the photodiode to the charge transfer channel and from the charge transfer channel to a predetermined portion of the CCD, and wherein the first transferring electrode is located at a first level of the three-level structure, the second and the fourth transferring electrodes are located at a second level of the three-level structure and remain within a vertical domain of the first transferring electrode in a wire region, and the third transferring electrode is located at a third level of the three-level structure; and applying a high pulse to the second and the third transferring electrodes simultaneously to transfer the electric charges from the photodiode to the charge transfer channel.

6 Claims, 18 Drawing Sheets

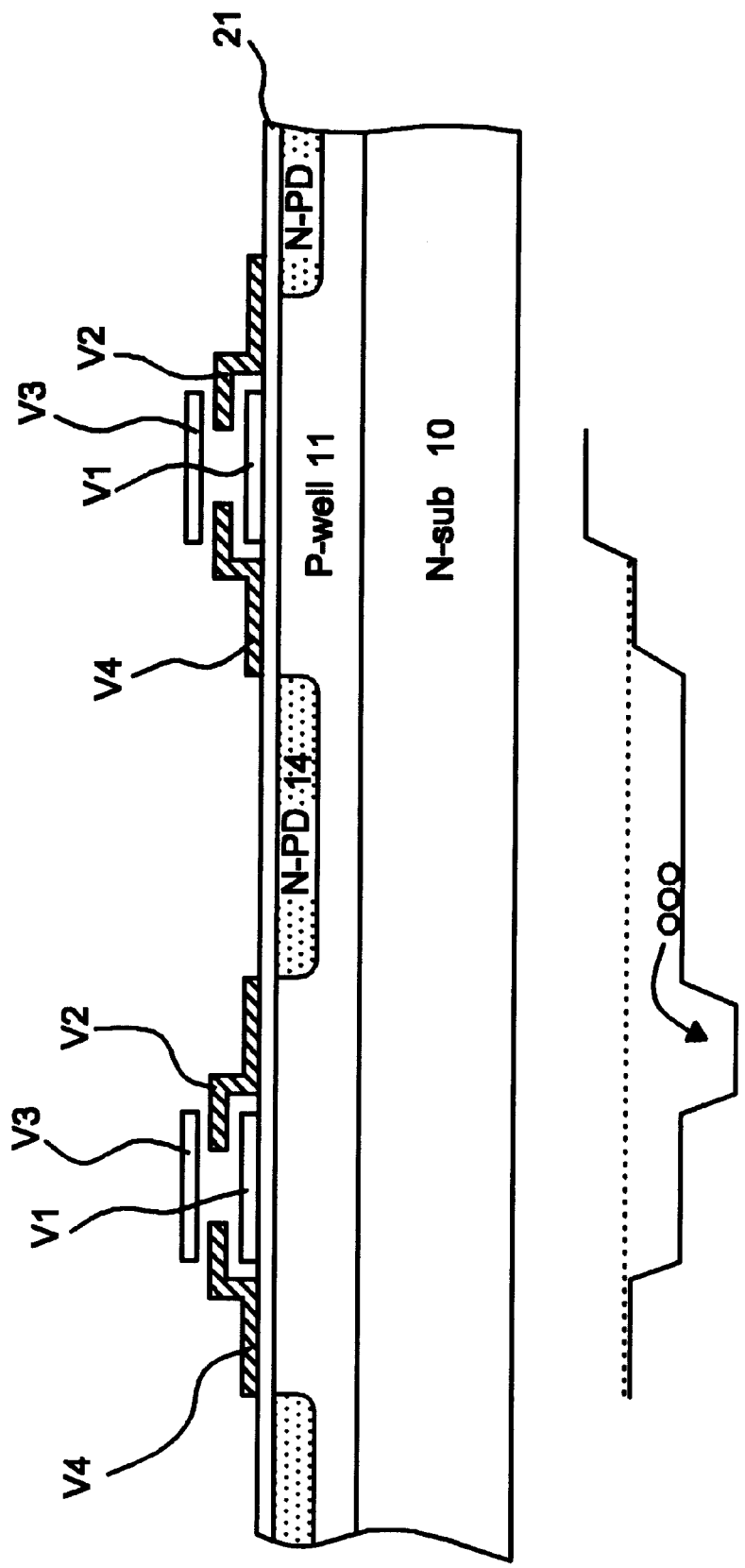

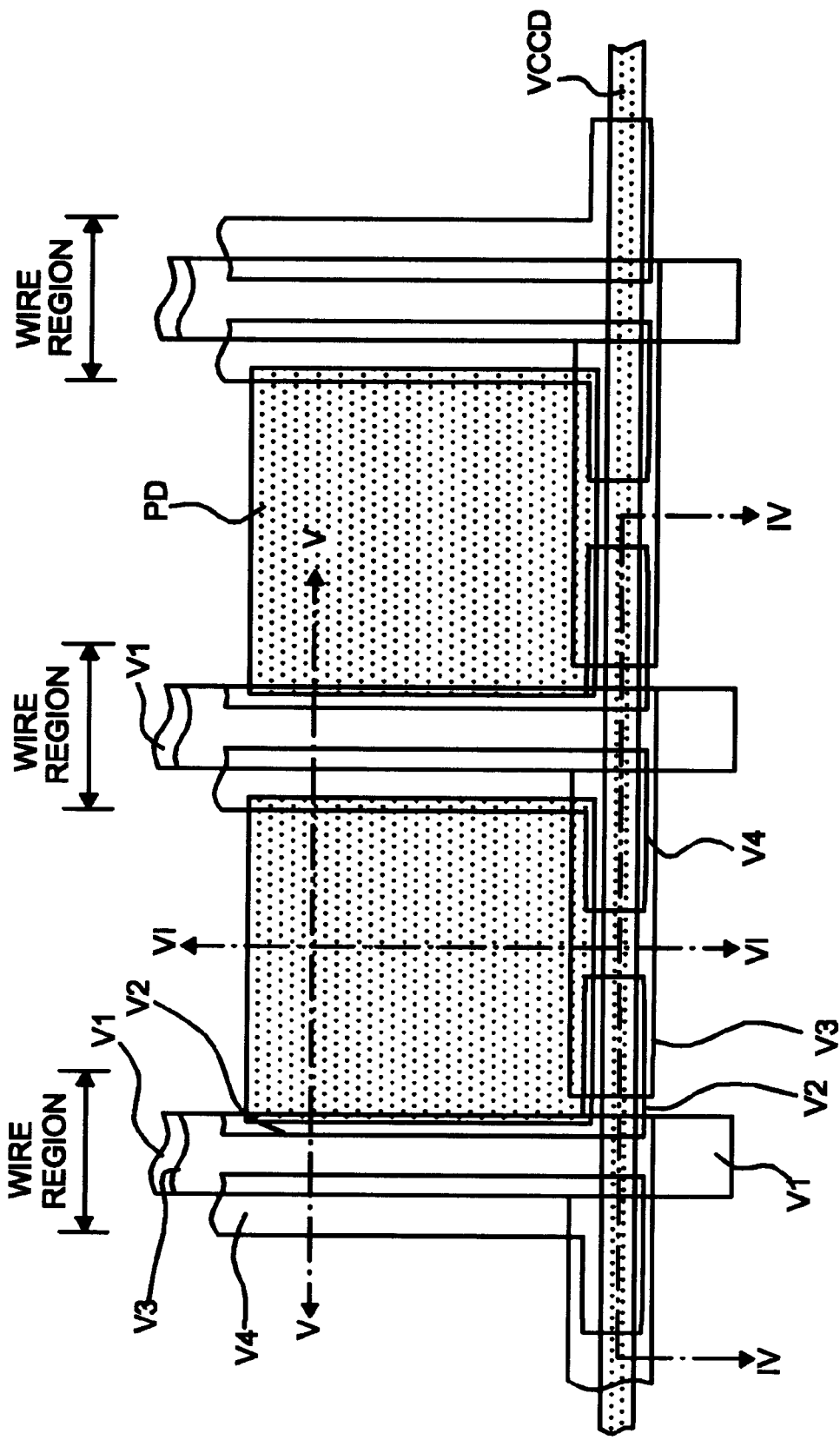

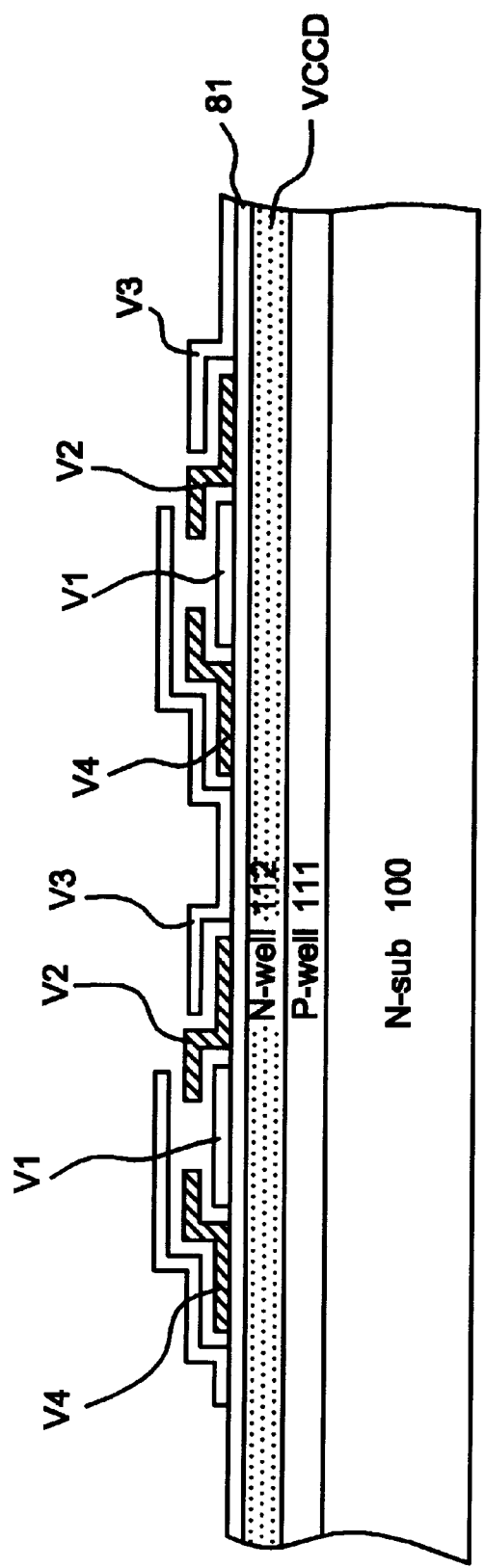

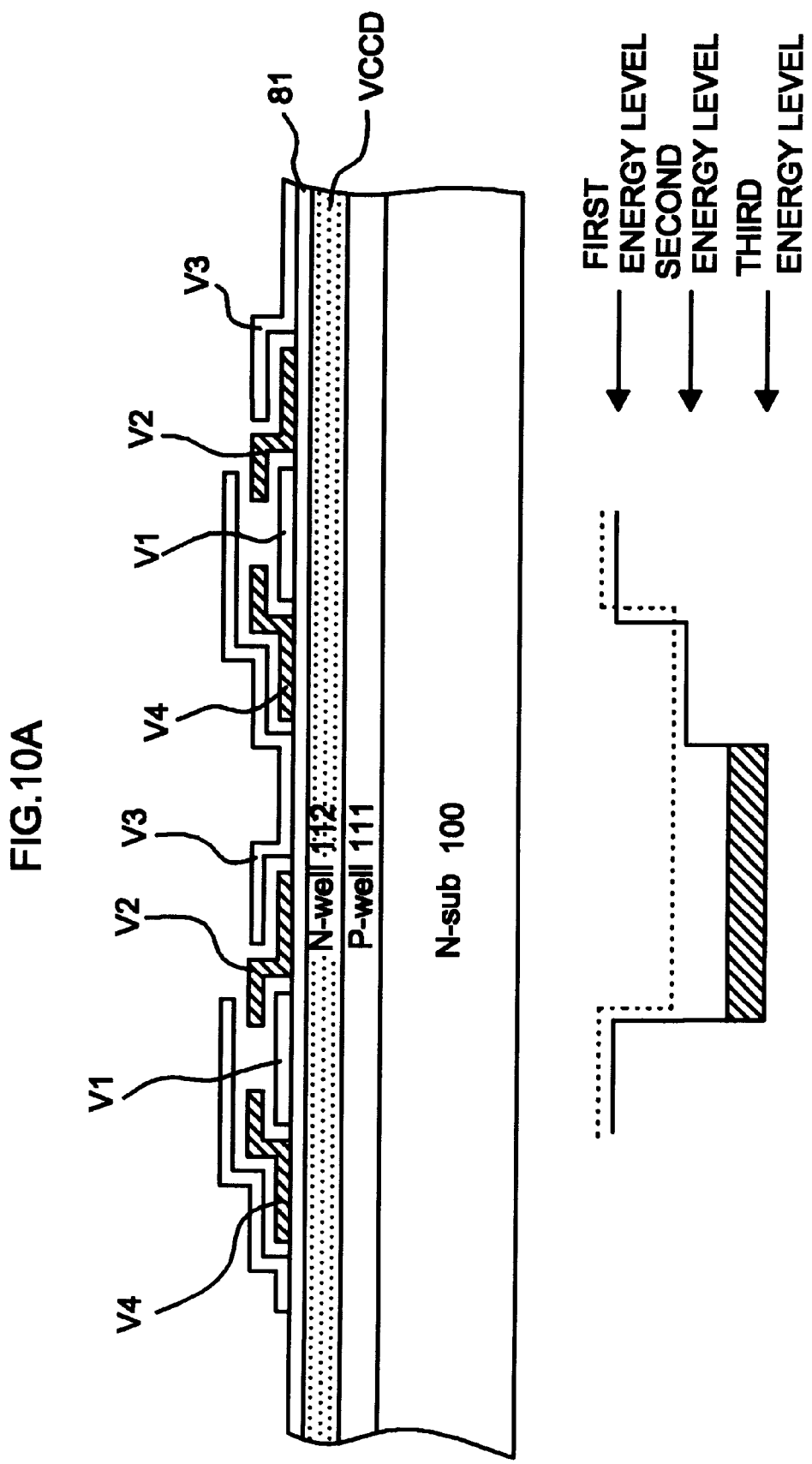

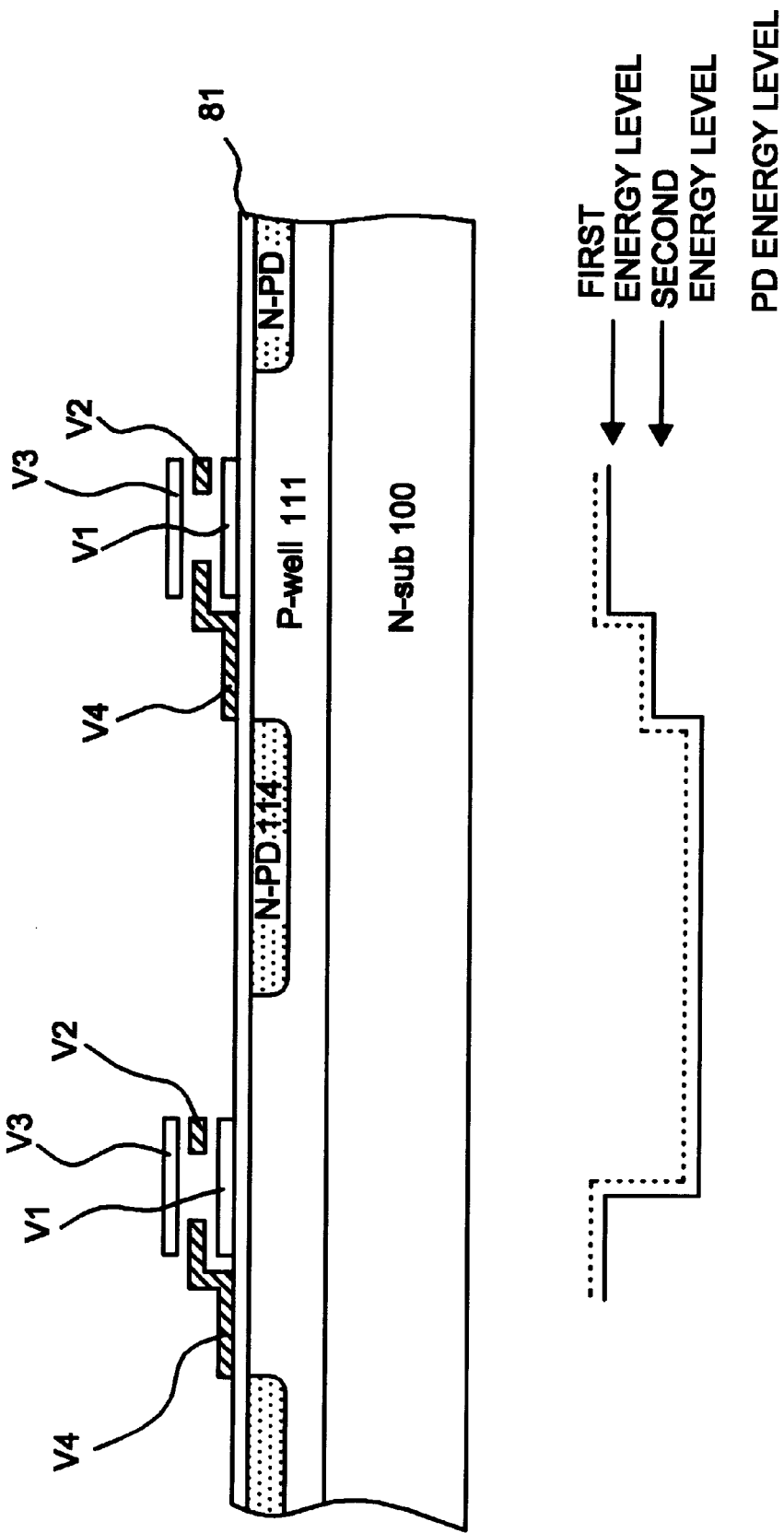

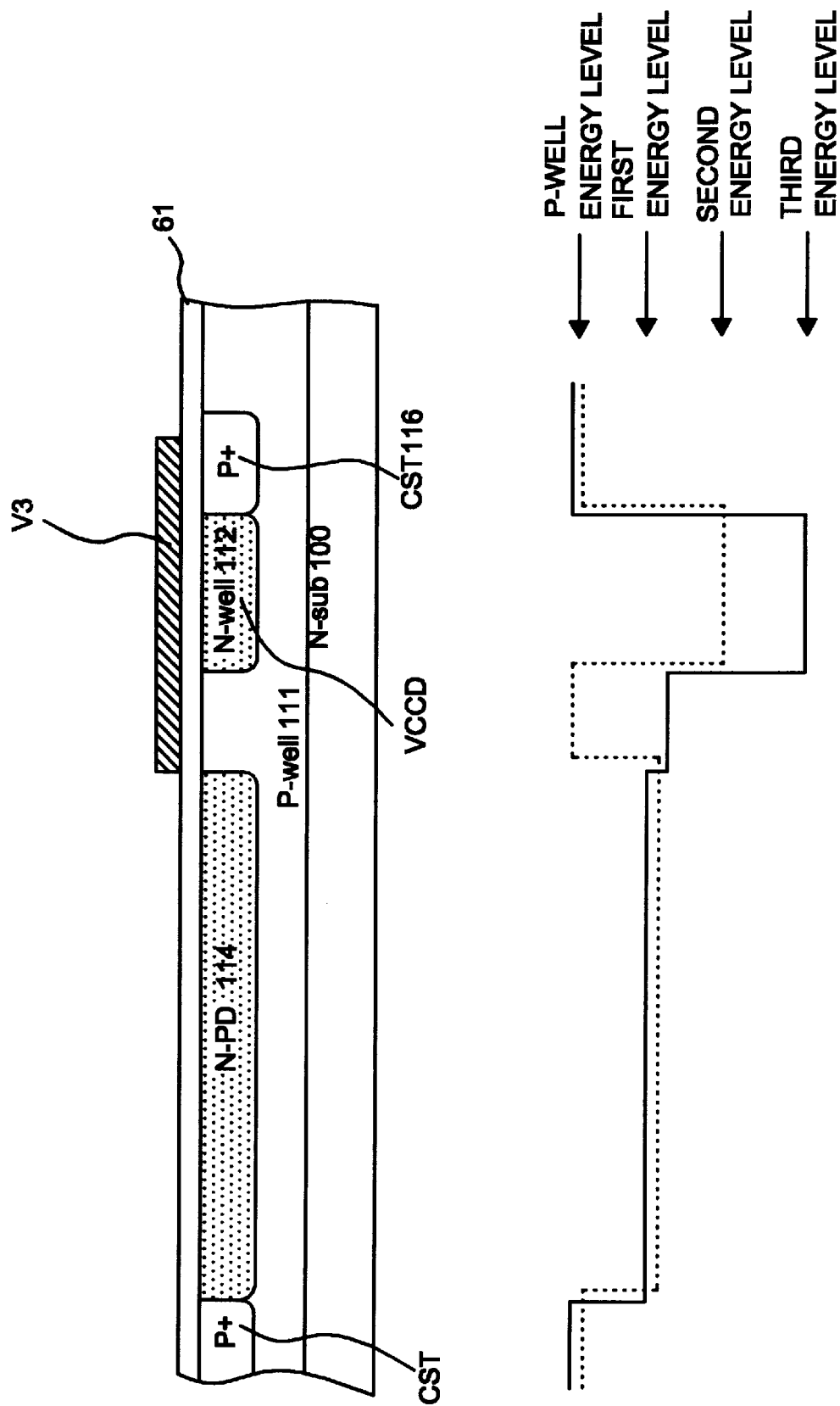

US 6,242,768 B1

1

CHARGE COUPLED DEVICE AND A DRIVING METHOD THEREOF

This Application claims the benefit of Korean application no. 98-23806 filed on Jun. 24, 1998, which is hereby incorporated by reference.

BACKGROUND OF THE INVENTION

1. Field of the Invention

The present invention relates to a charge coupled device (CCD) and a driving method, and more particularly, to a CCD for a four phase clocking signal and a driving method thereof with improved charge transfer efficiency.

2. Discussion of Related Art

FIG. 1 shows a layout of a conventional CCD. In such a conventional CCD, electric charges are generated by light, transferred by a plurality of CCD cells which are arranged in a predetermined direction, and detected by a detector in the CCD. In other words, output signals are obtained by transferring electric charges excited by light through a plurality of channels and by amplifying the electric charges.

As shown in FIG. 1, a CCD which transforms video signals into electrical signals includes a pixel array having a plurality of unit cells. Each unit cell includes a photodiode (PD) which is a light-receiving region and a vertical charge coupled device (VCCD) which receives signal charges generated and accumulated in the photodiode. The CCD also includes a horizontal charge coupled device (HCCD) and a signal detector. Signal charges accumulated in photodiodes are outputted by the signal detector after being transferred to the VCCD and the HCCD.

FIG. 2 and FIGS. 3A–3C illustrate a CCD wherein a unit cell of the CCD for a four-phase locking signal is taken as a basis. FIG. 2 is a layout, FIG. 3A is a cross-sectional view taken along the line I—I in FIG. 2, FIG. 3B is a cross-sectional view taken along the line II—II in FIG. 2, and FIG. 3C shows a cross-sectional view taken along the line III—III in FIG. 2.

In the CCD shown in FIGS. 2 and 3A–3C, a P type well P-well 11 is formed in an N type substrate N-sub 10. In the P-well 11, an N type well N-well 12 for a vertical charge coupled device region and a plurality of N type photodiodes N-PD 14 are arranged. A channel stopping layer CST 16 heavily doped with P type impurities is also formed in the P-well 11 surrounding a unit cell consisting of the N type photodiode N-PD 14 and a portion of the vertical charge coupled device.

A first insulating layer 21 is formed on the substrate which includes the photodiodes N-PD 14, the vertical charge coupled device and the channel stopping layer CST 16. Four transferring electrodes V1, V2, V3 and V4 having a three-level structure are formed on the first insulating layer 21.

The four transferring electrodes V1, V2, V3 and V4 are arranged in order. The level structure of the four transferring electrodes in a wire region, i.e., the space between two photodiodes, is shown in FIGS. 3B. The first transferring electrode VI is over the first insulating layer 21. The second and the fourth transferring electrodes V2 and V4, with ends extended beyond the first transferring electrode V1, are located over the first transferring electrode V1. The third transferring electrode V3 is located over the second and the fourth transferring electrodes V2 and V4.

FIG. 4 shows clocking pulses during a reading mode when signal charges of photodiodes are transferred to a vertical charge coupled device in the conventional CCD. FIGS. 5A–5C show transfer potential profiles of the CCD along lines I—I, II—II and III—III in FIG. 2, respectively.

Referring to FIG. 4, at time t1, the pulses of (V1, V2, V3, V4) are (L,H,H,H) and the potential profile is expressed as

2 the dotted line shown in FIGS. 5A to 5C. The substrate portion corresponding to the lower part of the first transferring electrode V1 has a first energy level, while the substrate portions corresponding to the lower parts of the second and the fourth transferring electrodes V2 to V4 have a second energy level lower than the first energy level.

As shown in FIG. 5C, the P type well P-well 11 works as a potential barrier between the potential wells of the photodiode N-PD 14 and the vertical charge coupled device VCCD in the N-well 12, since the energy level of the P type well P-well 11 is higher than that of the N type well N-well 12. The electric charges generated by light in the photodiode N-PD 14 are held in the potential well of the photodiode N-PD 14 until the barrier disappears instead of being transferred directly to the vertical charge coupled device in the N-well 12.

At time t2, the pulses of (V1, V2, V3, V4) are (L,H,HH,H) and the potential profile is expressed as the solid line shown in FIGS. 5A to 5C. Compared with the profile at t1, the substrate portions corresponding to the first, the second and the fourth transferring electrodes V1, V2 and V4 maintain the same energy level. However, the substrate portion corresponding to the lower part of the third transferring electrode V3 has a third energy level which is lower than the second energy level. Namely, the substrate portion corresponding to the lower part of the third electrode V3 has the third energy level when a high pulse is applied to the third transferring electrode V3.

As shown in FIG. 5C, signal charges stored in the photodiode N-PD 14 move into the ubstrate corresponding to the lower part of the third transferring electrode V3 since the potential barrier between the channels of the photodiode N-PD 14 and the vertical charge coupled device in the N-well 12 becomes sufficiently lower than the energy level of the photodiode N-PD 14 due to the high pulse applied to the third transferring electrode V3. Namely, electrons trapped in the potential well of the photodiode N-PD 14 are transferred to the vertical charge coupled device in the N-well 12 as the third transferring electrode V3 works as a reading gate.

At this time, the potential well of the wire region remains unchanged by the first, the second and the fourth transferring electrodes V1, V2, and V4 when the high pulse is applied to the third transferring electrode V3 during the reading mode. Thus, the potential well of the wire region is stable at t2 as compared to that at t1, thereby resulting in a charge transfer in one way from the photodiode N-PD 14 to the vertical charge coupled device.

At time t3, since the pulses of (V1, V2, V3, V4) are (L,H,H,H), i.e., the same as at t1, the potential profile is expressed as the dotted line shown in FIGS. 5A to 5C, which is the same as those at t1. As the substrate corresponding to the lower part of the third transferring electrode V3 becomes higher, so does the potential barrier between the photodiode N-PD 14 and the vertical charge coupled device. Eventually, the potential profiles become the same as the dotted line, thereby stopping the charge transfer from the N-PD 14 to the vertical charge coupled device. Then, the CCD proceeds in the following sequences so that signal charges are transferred when the four phase clocking signal is applied to the four charge transfer electrodes V1–V4.

As shown in FIG. 5A, the driving pulse for the reading mode makes the third transferring electrode V3 function as the reading gate. Only the third transferring electrode V3 becomes turned on. Therefore, an image lag may happen due to the insufficient charge transfer which results from the narrow width of the charge transfer path from the photodiode to the vertical charge coupled device.

FIG. 6 shows a potential profile of a photodiode and a vertical charge coupled device according to another type of conventional CCD. Here, the second transferring electrode V2 together with the third transferring electrode V3 may be used for reading. But, during a reading mode, stable charge transfers from the photodiode to the vertical charge coupled device is hard to achieve since the potential well of the photodiode varies due to the high pulse applied to the second transferring electrode V2. That is because the second transferring electrode V2 is located at a position which influences the profiles of the potential well of the photodiode in the wire region.

Referring to FIG. 6, compared to the potential level shown in FIG. 5B at time t1, the potential level of the substrate corresponding to the photodiode is lowered since a high pulse is applied to the second transferring electrode V2 when the second transferring electrode V2 is used as the reading gate. As a result, a portion of electric charges which are supposed to be transferred to the vertical charge coupled device are gathered at the substrate portion corresponding to the second transferring electrode in the wire region. Therefore, the charge transfer efficiency from the photodiode to the vertical charge coupled device is lowered. Also, signal charges may be mixed with each other when there are excessive electric charges due to the lowered barrier between the adjacent photodiodes.

Accordingly, an improved structure of the transferring electrode in the wire region is desired. Also, a driving method for widening a charge transfer path from a photodiode to a vertical charge coupled device is required.

SUMMARY OF THE INVENTION

Accordingly, the present invention is directed to a charge coupled device and driving method thereof that substantially obviates one or more of the problems due to limitations and disadvantages of the related art.

An object of the present invention is to provide a CCD using four transferring electrodes which improve the charge transfer efficiency from a photodiode to a vertical charge coupled device by using two transferring electrodes as reading gates, thereby widening the electric charge transfer path.

Another object of the present invention is to provide a CCD having a stable potential profile between two adjacent photodiodes by locating the two transferring electrodes which function as reading gates so that they are not extended out over the lower transferring electrode.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a CCD of the present invention includes a first conductive type semiconductor substrate; a second conductive type photodiode in the semiconductor substrate; a second conductive type charge transfer channel in the semiconductor substrate; and a charge transferring means including a first, a second, a third and a fourth transferring electrodes over the semiconductor substrate in a three-level structure type, transferring electric charges in the photodiode to the charge transfer channel by a certain electrical signal and transferring the electric charges in the charge transfer channel to a predetermined portion, wherein the first transferring electrode is located at a first level of the three-level structure, the second and the fourth transferring electrode are located at a second level of the three-level structure and remain within a vertical domain of the first transferring electrode in a wire region which is located between the photodiode and a another photodiode vertically adjacent the photodiode and, the third transferring electrode is located at a third level of the three-level structure.

In another aspect, a driving method of a CCD of the present invention includes the steps of providing a CCD comprising a first conductive type semiconductor substrate; a second conductive type photodiode in the semiconductor substrate; a second conductive type charge transfer channel in the semiconductor substrate; and a charge transferring means including a first, a second, a third and a fourth transferring electrodes over the semiconductor substrate in a three-level structure type, transferring electric charges in the photodiode to the charge transfer channel by a certain electrical signal and transferring the electric charges in the charge transfer channel to a predetermined portion, wherein the first transferring electrode is located at a first level of the three-level structure, the second and the fourth transferring electrode are located at a second level of the three-level structure and remain within a vertical domain of the first transferring electrode in a wire region which is located between the photodiode and a another photodiode vertically adjacent the photodiode and, the third transferring electrode is located at a third level of the three-level structure; and, applying a high pulse to the second and the third electrode simultaneously in order to transfer signal charges from the photodiode to the charge transfer channel.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings:

FIG. 6 shows a potential profile of a photodiode and a vertical charge coupled device of another conventional CCD;

FIG. 7 shows a layout of a pixel array in a CCD according to the present invention;

FIG. 8A to FIG. 8C are cross-sectional views taken along the lines IV—IV, V—V and VI—VI in FIG. 7, respectively;

FIG. 10A to FIG. 10C show potential profiles of a photodiode and a vertical charge coupled device during the reading operation according to the present invention.

DETAILED DESCRIPTION OF THE PREFERRED EMBODIMENTS

Reference will now be made in detail to the preferred embodiments of the present invention, examples of which are illustrated in the accompanying drawings.

Figure 1:
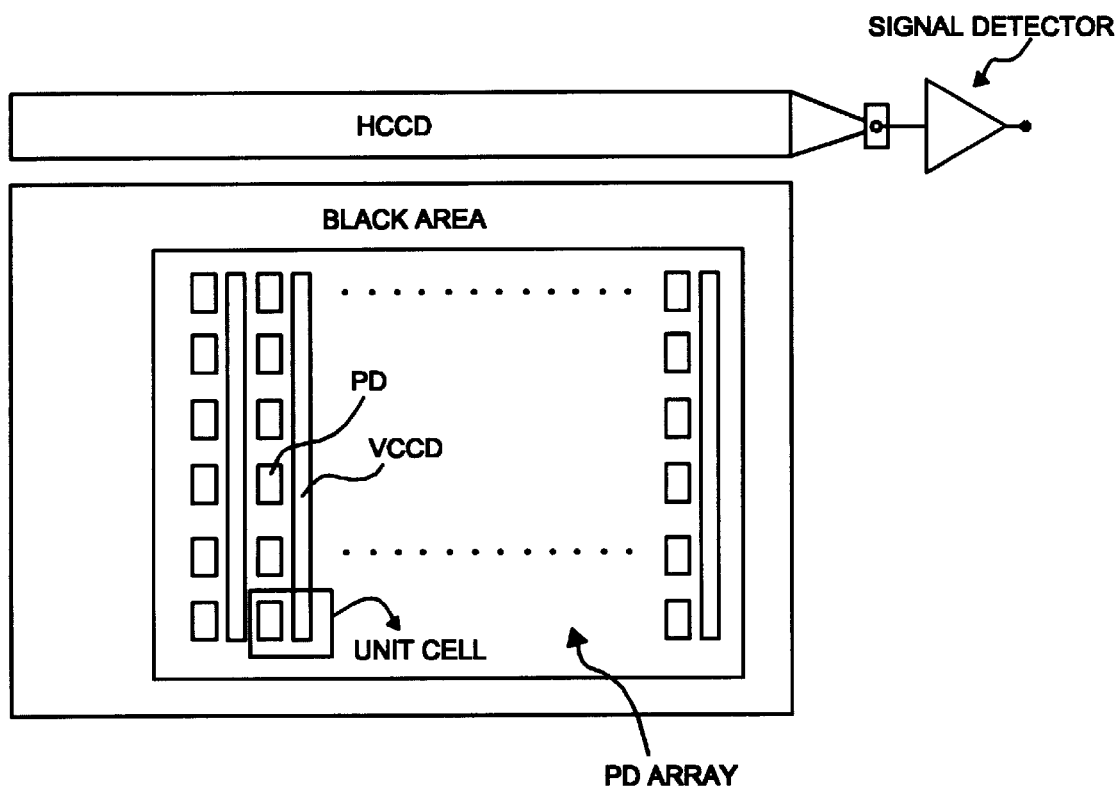
FIG. 1 shows a layout of a conventional CCD.
Figure 2:
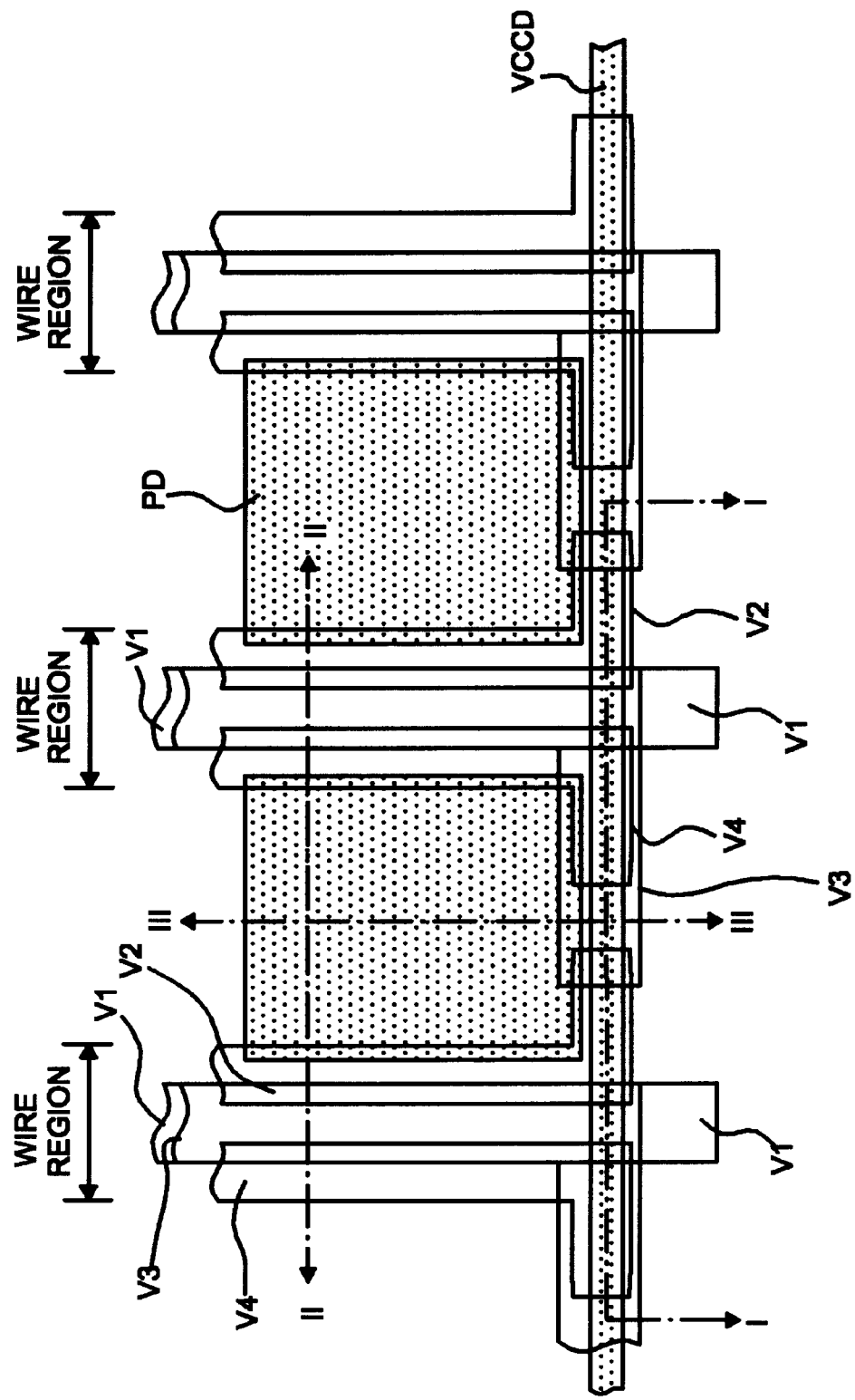
FIG. 2 shows a layout of a pixel array in a conventional CCD.
Figure 3A:
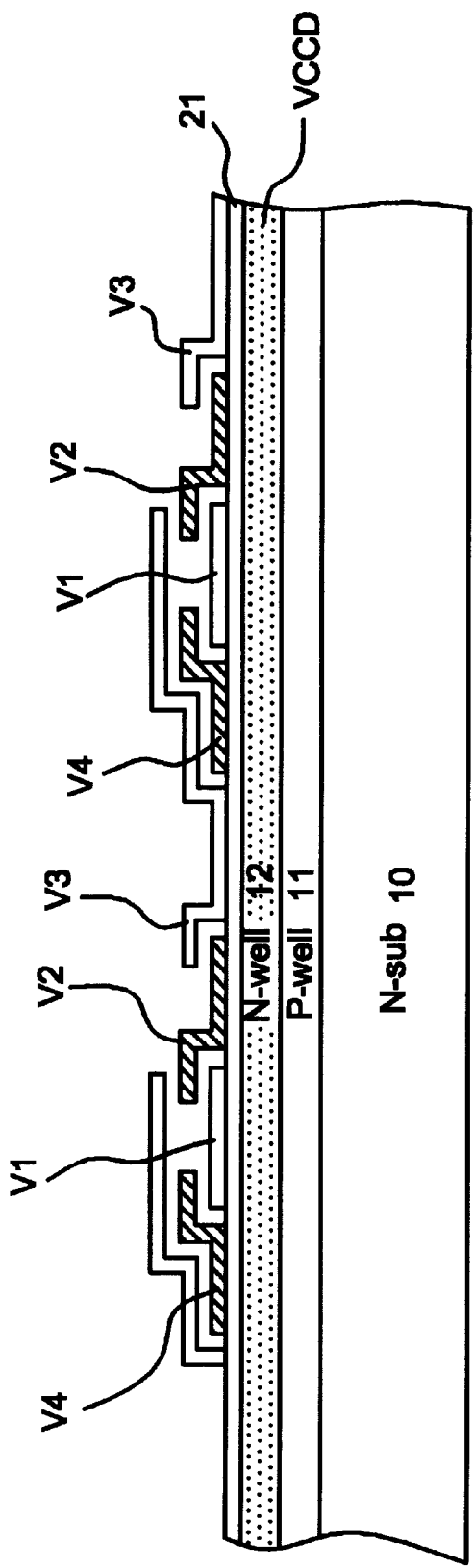
FIGS. 3A to FIGS. 3C are cross-sectional views taken along the lines I—I, II—II and III—III in FIG. 2, respectively.
Figure 3B:
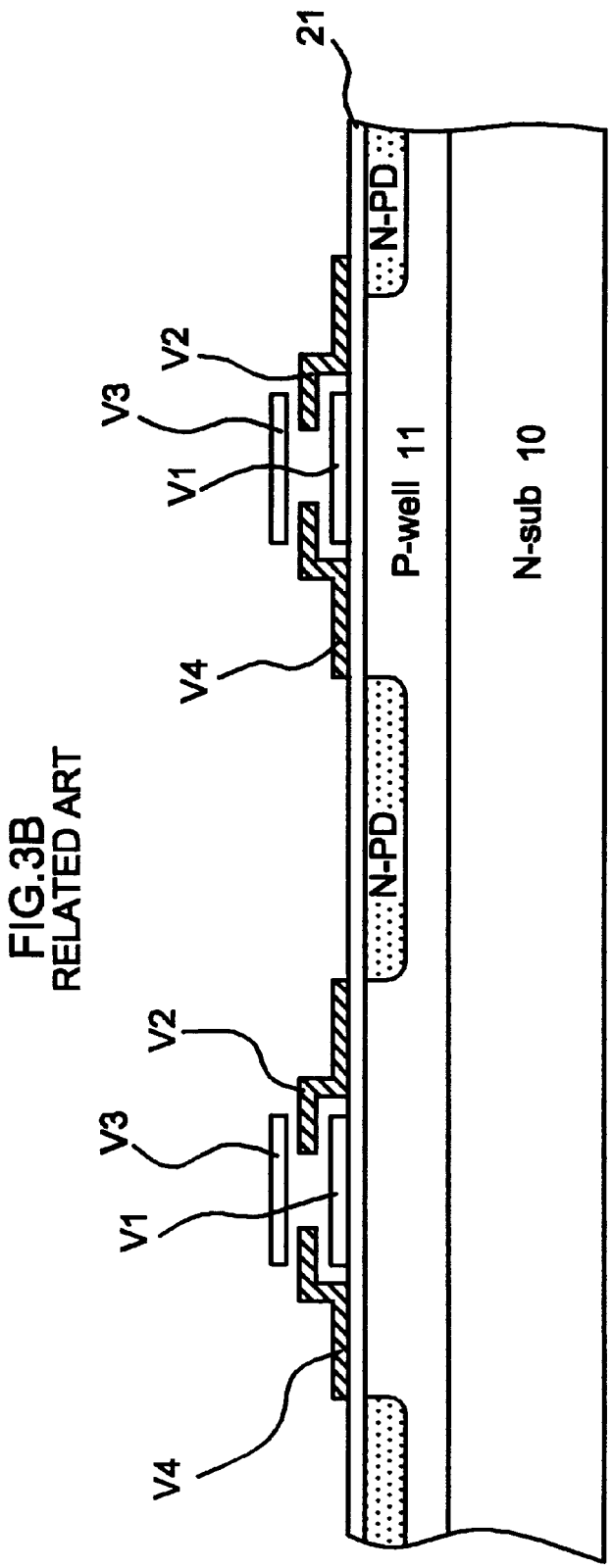
Figure 3C:
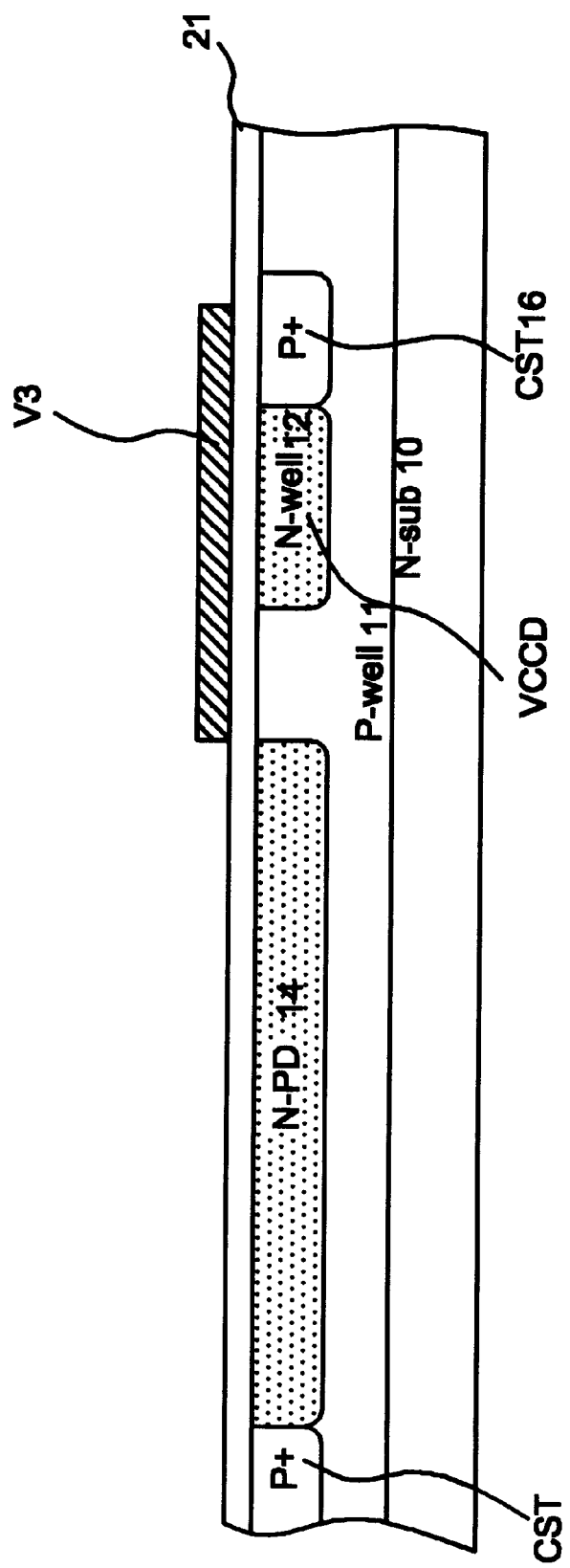
Figure 4:
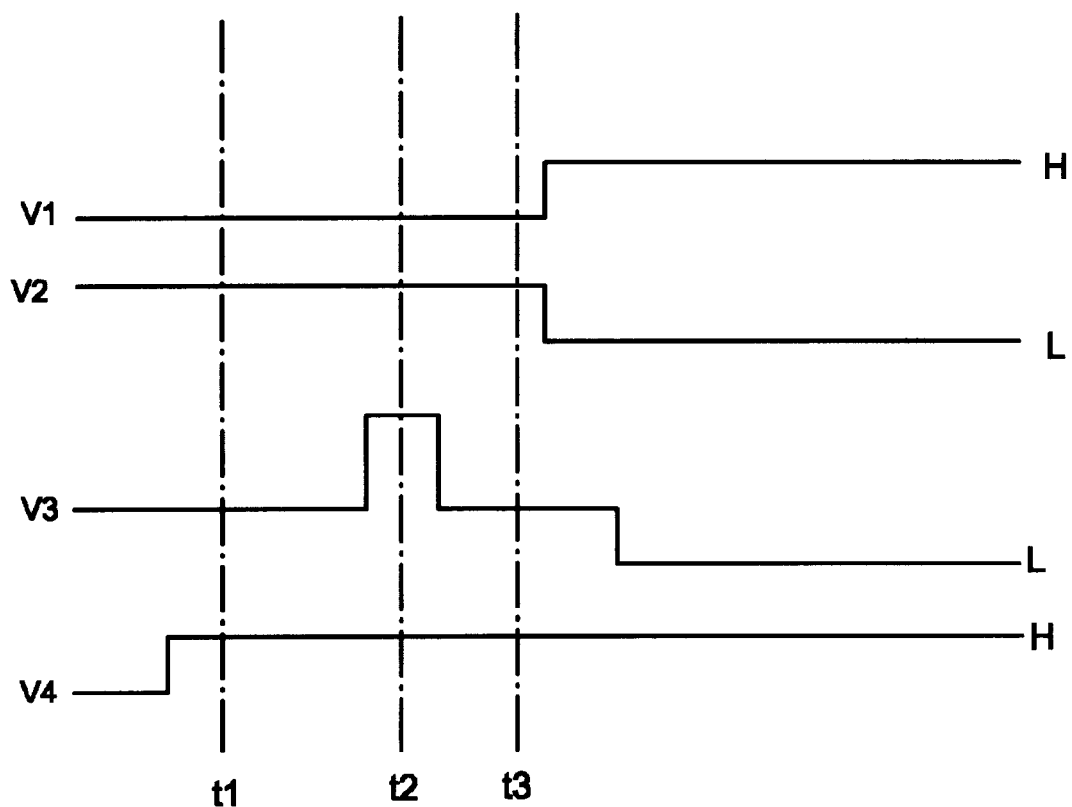
FIG. 4 shows driving pulses for the reading mode of the CCD in FIG. 2.
Figure 5A:
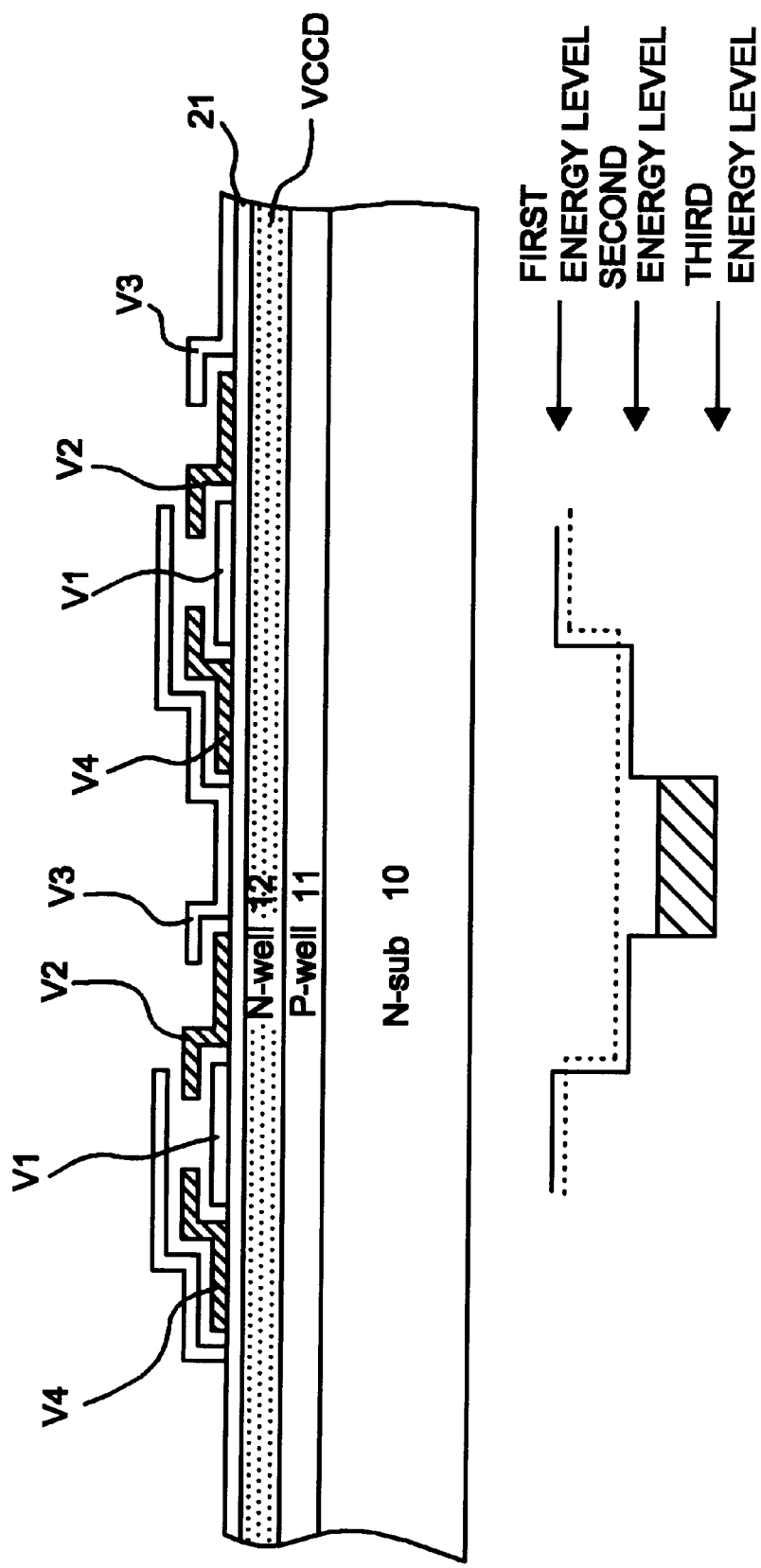
FIG. 5A to FIG. 5C show potential profiles of a photodiode and a vertical charge coupled device of the conventional CCD during a reading operation.
Figure 5B:
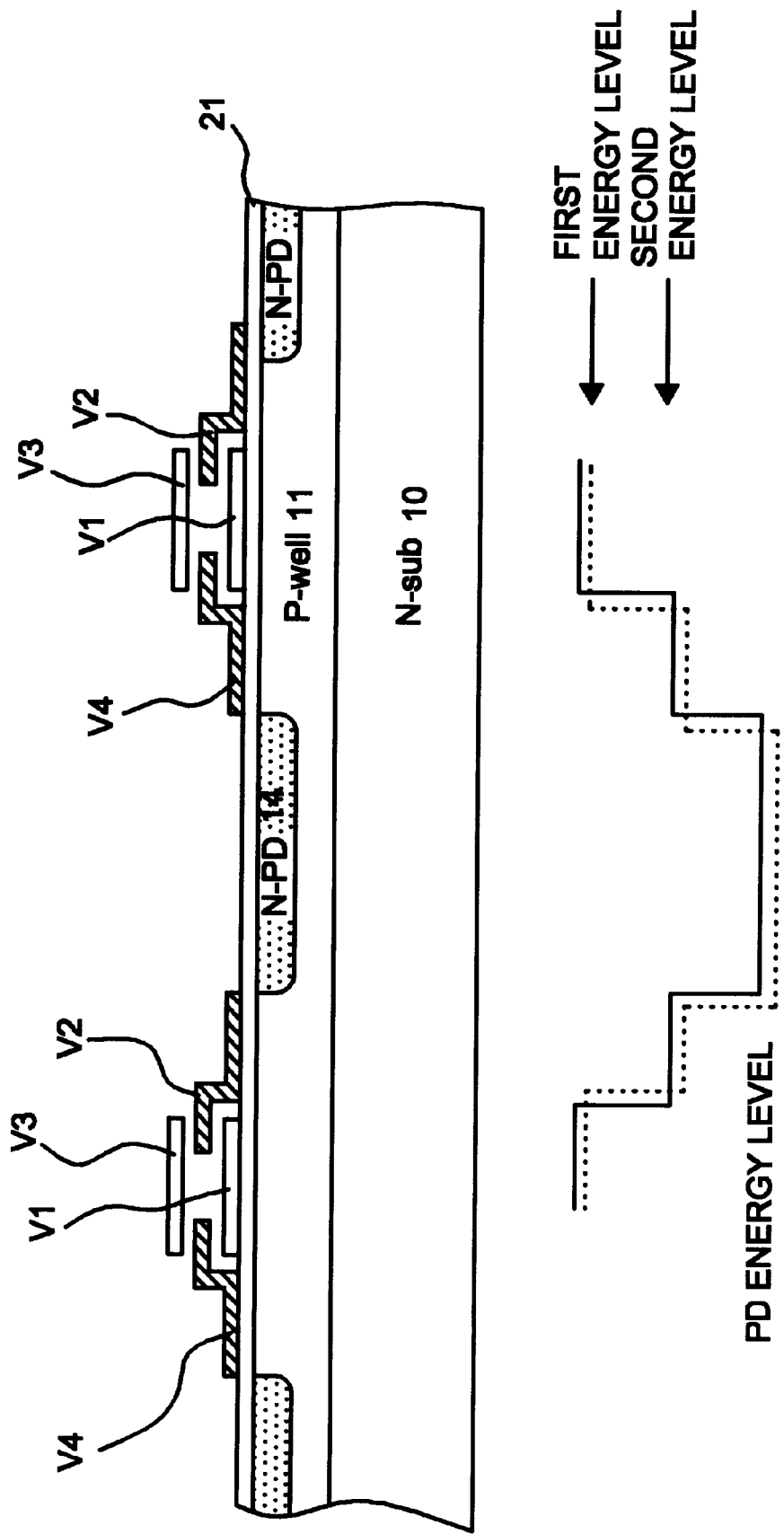
Figure 5C:
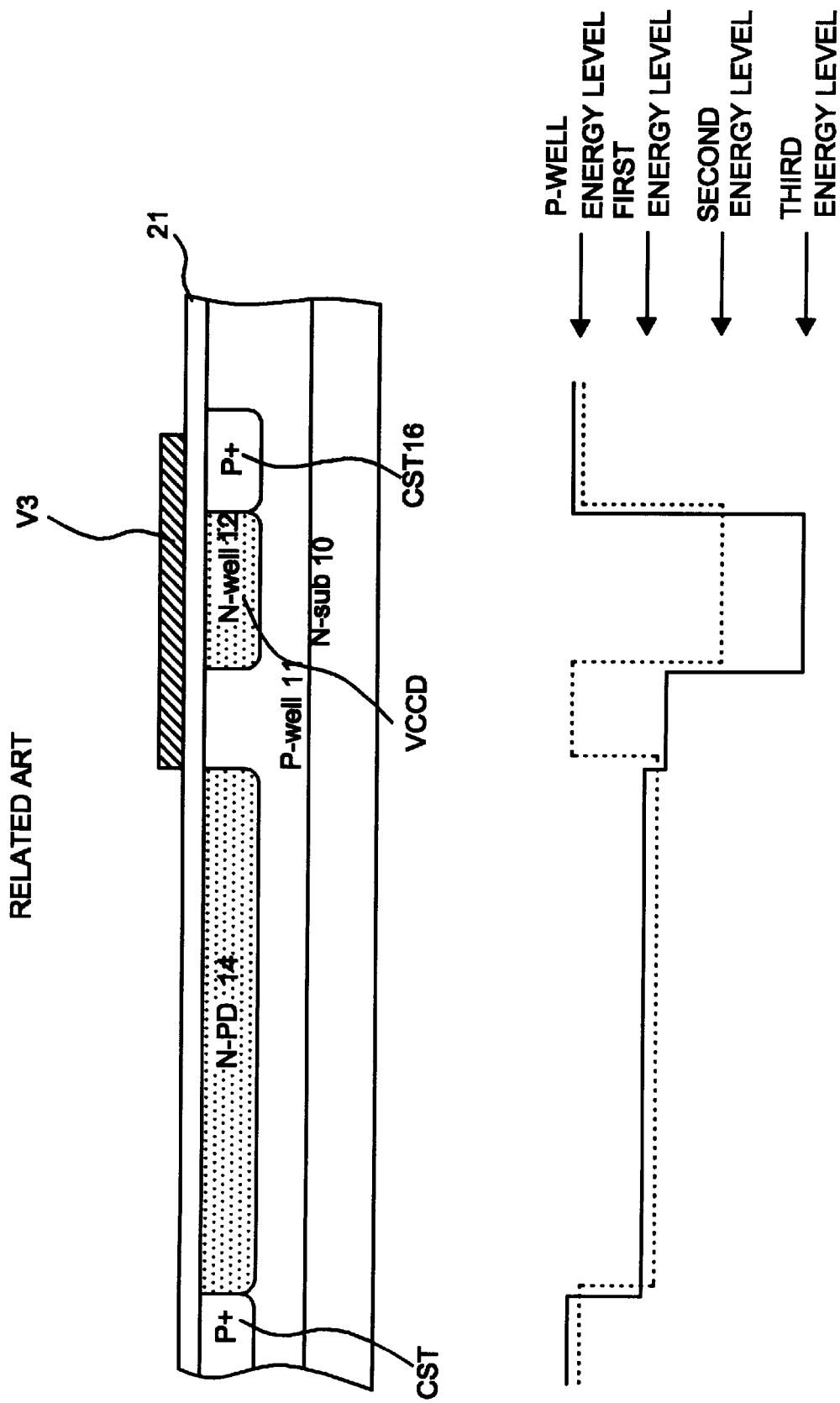
Figure 8B:
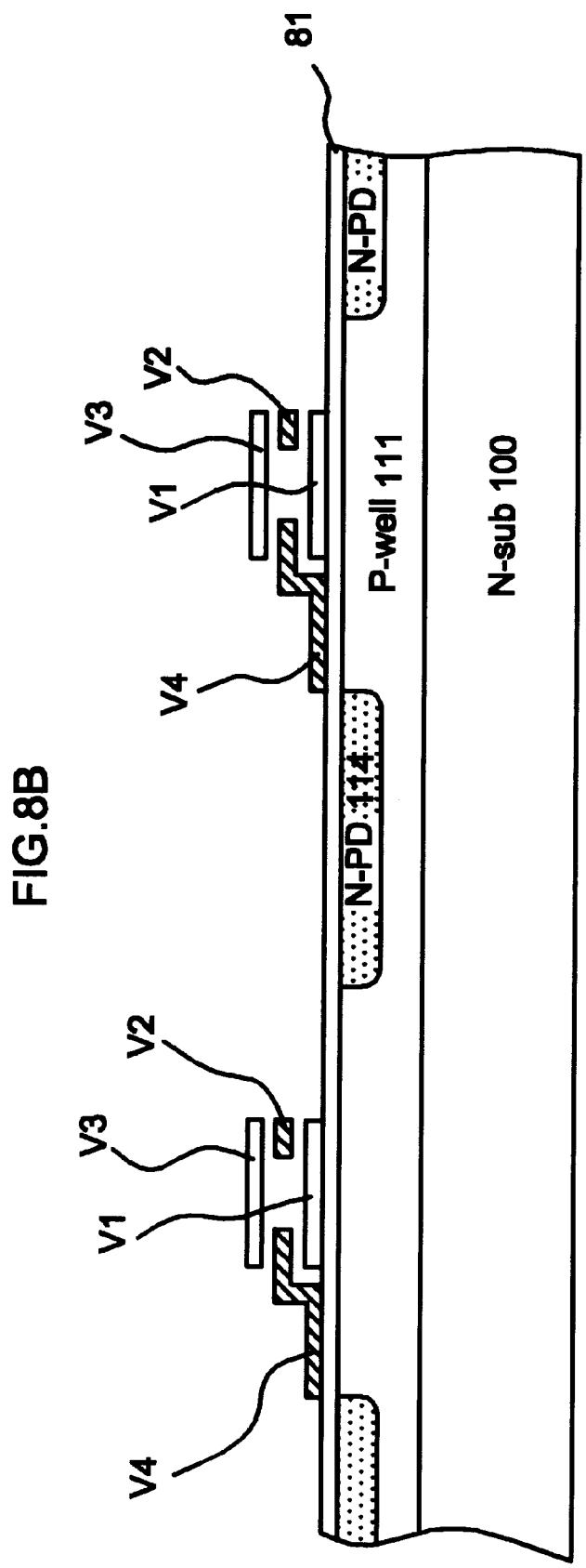
Figure 8C:
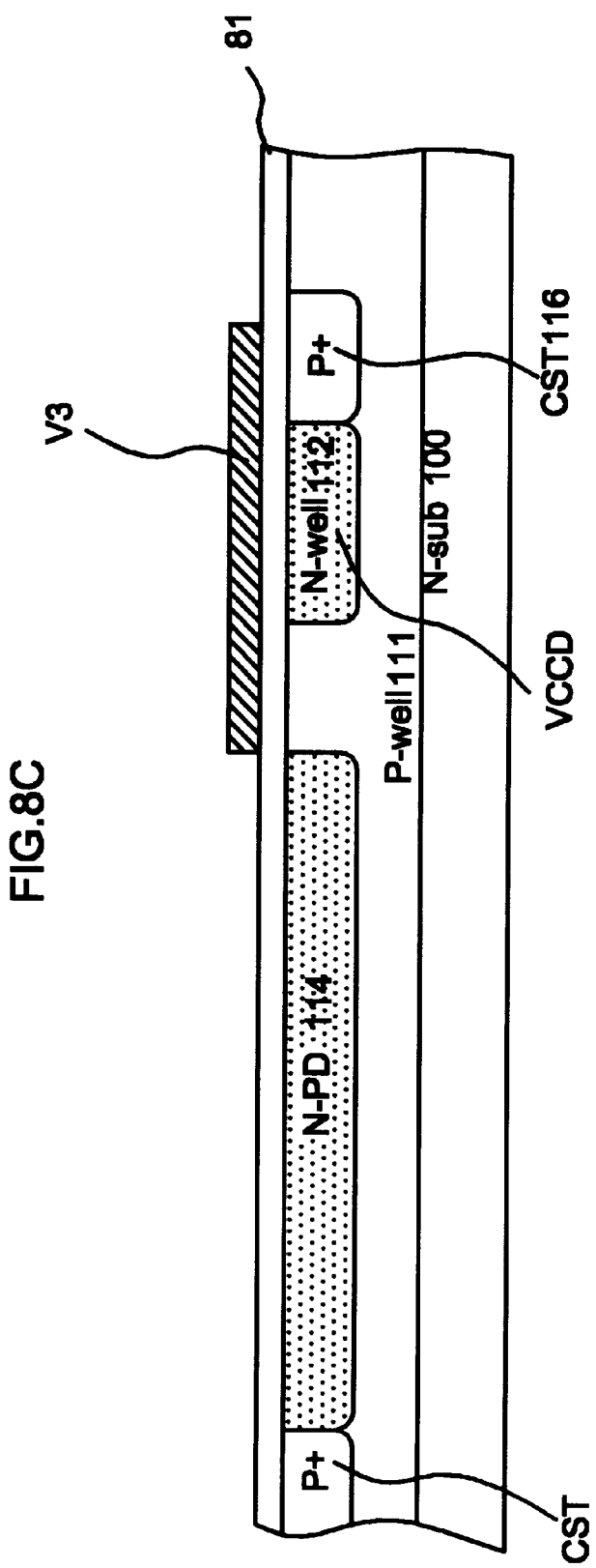

FIG. 7 and FIGS. 8A–8C illustrate a CCD according to the present invention wherein a unit cell of the CCD for a four-phase clocking signal is taken as a basis. FIG. 7 is a layout, FIG. 8A is a cross-sectional view taken along the line IV—IV in FIG. 7, FIG. 8B is also a cross-sectional view taken along the line V—V in FIG. 7, and FIG. 8C shows a cross-sectional view taken along the line VI—VI in FIG. 7.

In a CCD according to the present invention, a P type well P-well 111 is formed in an N type substrate N-sub 100. In the P type well P-well 111 , an N type well N-well 112 for a vertical charge coupled device region and a plurality of N type photodiodes N-PD 114 are arranged. A channel stopping layer CST 116 heavily doped with P type impurity is also formed in the P type well P-well 111 surrounding a unit cell consisting of the N type photodiode N-PD 114 and a portion of the vertical charge coupled device.

A first insulating layer 81 is formed on the substrate which includes the photodiodes N-PD 114, the vertical charge coupled device and the channel stopping layer CST 116. Four transferring electrodes V1, V2, V3 and V4 having a three-level structure are formed on the first insulating layer 81.

The four transferring electrodes V1–V4 are formed by three poly-silicon deposition and etching steps (hereinafter abbreviated as poly-silicon process). The first transferring electrode V1 is formed on the first insulating layer 81 by a first poly-silicon process, the second transferring electrode V2 and the fourth transferring electrode V4 are formed over the first transferring electrode V1 by a second poly-silicon process, and the third transferring electrode V3 is formed by a third poly-silicon process. The above four transferring electrodes are arranged in the direction which is perpendicular to a photodiode in order to form a vertical charge coupled device channel. At this time, the four transferring electrodes V1–V4 are insulated by insulating layers, respectively. A wire region where the transferring electrodes pass through is between two adjacent photodiodes.

In the vertical charge coupled device channel, the third transferring electrode V3 lies between the first transferring electrode VI and the first transferring electrode in the adjacent cell. The second transferring electrode V2 lies between the first transferring electrode V1 and the third transferring electrode V3. The fourth transferring electrode V4 is between the third transferring electrode V3 and the first transferring electrode V1. Namely, the first, the fourth, the third, and the second transferring electrodes V1-V4-V3-V2 are arranged in order. In this case, the third transferring electrode V3 covers the most of the second transferring electrode V2 over the vertical charge coupled device channel. Consequently, the second transferring electrode V2 is Dverlapped with the third transferring electrode V3 to the utmost.

In the wire region, the structure of the four transferring electrodes is a three-level structure as shown in FIG. 8B. The first transferring electrode V1 is located on the first insulating layer 81. The second transferring electrode V2 and the fourth transferring electrode V4 are located over the first transferring electrode V1. In this case, only the fourth transferring electrode of the two electrodes is extended beyond the first transferring electrode V1. Therefore, the second transferring electrode V2 and the third transferring electrode V3 are not extended beyond the first transferring electrode V1.

In the present invention, both the second transferring electrode V2 and the third transferring electrode V3 are used for reading. Therefore, during a reading mode, it is very effective to locate the second and the third transferring electrodes V2 and V3 of the wire region within the domain of the upper part of the first transferring electrode V1. This prevents the profile of the potential well between the adjacent photodiodes from getting unstable due to a high pulse applied to the second transferring electrode V2. The above-explained structure of the four transferring electrodes reduces the width of the wire region, thereby increasing the photodiode area.

Figure 9:
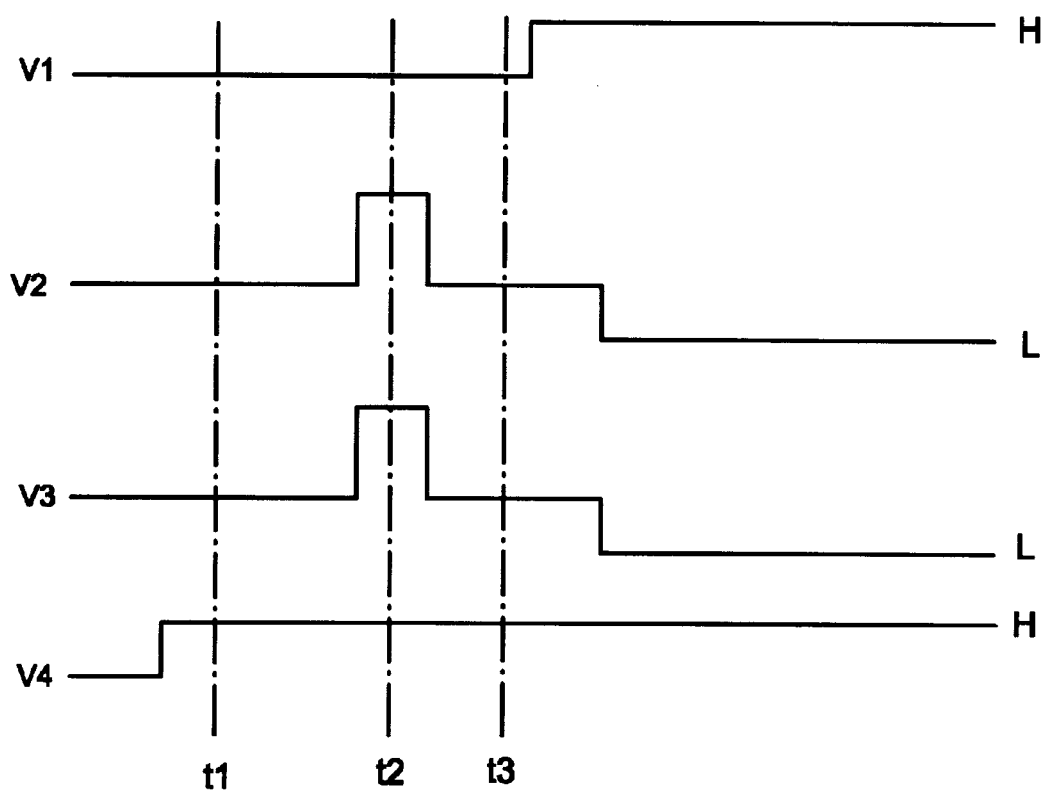
FIG. 9 shows driving pulses for the reading mode according to the present invention.

FIG. 9 shows graphs of clocking pulses during the reading mode when signal charges of photodiodes are transferred to a vertical charge coupled device in the CCD according to the present invention. FIGS. 10A–10C show transfer profiles of the CCD along lines IV—IV, V—V and VI—VI in FIG. 7, respectively.

Referring to FIG. 9, at time t1, the pulses of (V1, V2, V3, V4) are (L,H,H,H) and the potential profile is expressed as the dotted line shown in FIGS. 10A to 10C. The substrate portion corresponding to the lower part of the first transferring electrode V1 has a first energy level, while the substrate portions corresponding to the lower parts of the second, third and the fourth transferring electrodes V2 to V4 have a second energy level lower than the first energy level.

Referring to FIG. 10C, the P type well P-well 111 works as a barrier between the potential wells of the photodiode N-PD 114 and the vertical charge coupled device in the N-well 112, since the energy level of the P type well P-well 111 is higher than that of the N type well N-well 112 in which the channel between the photodiode and the vertical charge coupled device is formed. Instead of being transferred directly to the vertical charge coupled device, the electric charges generated by light signals from the photodiode N-PD 114 are held in the potential well of the photodiode N-PD 114 until the barrier disappears.

At time t2, the pulses of (V1, V2, V3, V4) are (L,HH, HH,H) and the potential profile is expressed as the solid line shown in FIGS. 10A to 10C. Compared with the profile at t1, the substrate portions corresponding to the first and the fourth transferring electrodes V1 and V4 maintain the same energy level. However, the substrate portions corresponding to the lower parts of the second and the third transferring electrodes V2 and V3 have a third energy level which is lower than the second energy level. Namely, the substrate portions corresponding to the lower parts of the second and the third electrodes V2 and V3 have the third energy level when a high pulse is applied to the second and the third transferring electrodes.

As shown in FIG. 10C, signal charges stored in the photodiode N-PD 114 gather into the substrate portion corresponding to the lower part of the third transferring electrode V3 since the potential barrier between the channels of the photodiode N-PD 114 and the vertical charge coupled device in the N-well 112 becomes sufficiently lower than the energy level of the photodiode N-PD 114 due to the high pulse applied to the second and the third transferring electrodes V2 and V3. Namely, electrons trapped in the potential well of the photodiode N-PD 114 are transferred to the vertical charge coupled device in the N-well 112 as the second and the third transferring electrodes V2 and V3 work as reading gates.

At this time, the potential well of the wire region remains unchanged by the first and the fourth transferring electrodes V1 and V4 when the high pulse is applied to the second and the third electrodes V2 and V3 during a reading mode. Thus, the potential well of the wire region is stable at t2 as compared to that at t1, thereby resulting in a charge transfer in one way from the photodiode N-PD 114 to the vertical charge coupled device.

In addition, the charge transfer path from the photodiode N-PD 114 to the vertical charge coupled device in the present invention becomes wider than that of a conventional CCD since both the second and the third transferring electrodes form the charge transfer path. In this case, the third transferring electrode V3 covers the most surface of the second transferring electrode V2 over the vertical charge coupled device channel. Therefore, electric charges are transferred in a stable fashion from the photodiode N-PD 114 to the vertical charge coupled device by the pulse applied to the second and the third transferring electrodes V2 and V3.

At time t3, the pulses of (V1, V2, V3, V4) are (L,H,H,H), i.e., the same as at t1, the potential profile is expressed as the dotted line shown in FIGS. 10A to 10C, which is the same as those at t1. As the substrate portions corresponding to the lower parts of the second and the third transferring electrodes V2 and V3 become higher, so is the potential barrier between the photodiode N-PD 114 and the vertical charge coupled device. Eventually, the potential profiles become the same as the dotted line, thereby stopping the charge transfer from the N-PD 114 to the vertical charge coupled device. Then, the CCD proceeds in the following sequences so that signal charges are transferred when the four phase clocking signal is applied to the four charge transfer electrodes V1–V4 in the charge transfer region.

In a CCD according to the present invention, two transferring electrodes in a wire region are used as reading gates and these two transferring electrodes are formed within a vertical domain of the first transferring electrode. Thus, in the present invention, a charge transfer path from a photodiode to a vertical charge coupled device is as twice as wide compared to that of a conventional CCD when a reading pulse which uses the two transferring electrodes for reading is applied. Accordingly, the electric charge transfer efficiency is improved and the undesired image lag is eliminated.

Also, it is possible to increase a photodiode area by means of developing the photodiode area to the lower part of the first transferring electrode without reducing the electrode line region. As a result, device sensitivity is improved.

Similarly, a method of driving the CCD of the present invention improves the electric charge transfer efficiency by increasing a charge transfer path from a photodiode to a vertical charge coupled device. This is achieved because the path is formed by two transferring electrodes for reading during a reading mode and a driving pulse is provided to both transferring electrodes.

Finally, during a reading mode, the driving pulse voltage of the present invention is lower than that of a conventional device. This makes the charge transfer easier and reduces the cost of the driving circuit.

It will be apparent to those skilled in the art that various modifications and variations can be made in the CCD and the driving method thereof of the present invention without departing from the spirit or scope of the invention. Thus, it is intended that the present invention covers the modifications and variations of this invention provided they come within the scope of the appended claims and their equivalents.

What is claimed is:

1. A charge coupled device (CCD) comprising:
   a semiconductor substrate with a first conductive type;
   a photodiode with a second conductive type in the semiconductor substrate;
   a charge transfer channel with the second conductive type in the semiconductor substrate; and
   a charge transfer element including a first, a second, a third and a fourth transferring electrode with a three-level structure over the semiconductor substrate, for transferring electric charges from the photodiode to the charge transfer channel and from the charge transfer channel to a predetermined portion of the CCD, wherein the first transferring electrode is located at a first level of the three-level structure, the second and the fourth transferring electrodes are located at a second level of the three-level structure, and the third transferring electrode is located at a third level of the three-level structure, and wherein in a wire region between the photodiode and an adjacent photodiode, the second and the third transferring electrodes are not extended beyond the first transferring electrode.

2. The CCD according to claim 1, wherein the photodiode is selectively overlapped with the first transferring electrode in the wire region.

3. The CCD according to claim 1, wherein the semiconductor substrate of the first conductive type is prepared by forming a well of the first conductive type in a semiconductor substrate of the second conductive type.

4. The CCD according to claim 1, wherein the second transferring electrode is overlapped with the third transferring electrode over the charge transfer channel.

5. A driving method of a charge coupled device (CCD) comprising the steps of:
   providing a CCD including a semiconductor substrate, a photodiode in the semiconductor substrate, a charge transfer channel in the semiconductor substrate, and a charge transferring element including a first, a second, a third and a fourth transferring electrode with a three-level structure over the semiconductor substrate, wherein the charge transferring element transfers electric charges from the photodiode to the charge transfer channel and from the charge transfer channel to a predetermined portion of the CCD, and wherein the first transferring electrode is located at a first level of the three-level structure, the second and the fourth transferring electrodes are located at a second level of the three-level structure, and the third transferring electrode is located at a third level of the three-level structure, and wherein in a wire region between the photodiode and an adjacent photodiode, the second and the third transferring electrodes are not extended beyond the first transferring electrode; and
   applying a high pulse to the second and the third transferring electrodes simultaneously to transfer the electric charges from the photodiode to the charge transfer channel.

6. The driving method according to claim 5, further comprising the step of applying a four phase clocking signal to the first to fourth transferring electrodes in order to transfer the electric charges having been transferred by the high pulse along a predetermined direction through the charge transfer channel.

* * * * *